United States Patent [19]

Lippits et al.

[11] 4,275,091
[45] Jun. 23, 1981

[54] METHOD OF DUPLICATING PLASTICS INFORMATION CARRIERS

[75] Inventors: Gerardus J. M. Lippits; Arnoldus J. M. Van Den Broek; Adriaan J. G. Op Het Veld; Rinse Dijkstra; Jelis De Jonge, all of Eindhoven, Netherlands

[73] Assignee: U.S. Philips Corporation, New York, N.Y.

[21] Appl. No.: 95,130

[22] Filed: Nov. 16, 1979

Related U.S. Application Data

[60] Continuation of Ser. No. 887,188, Mar. 16, 1978, abandoned, which is a division of Ser. No. 774,973, Mar. 7, 1977, abandoned.

[30] Foreign Application Priority Data

Oct. 15, 1976 [NL] Netherlands ..................... 7611395

[51] Int. Cl.$^3$ .............................................. B05D 3/06
[52] U.S. Cl. ................................. 427/53.1; 427/54.1; 427/355; 156/245; 156/246; 156/272
[58] Field of Search ................. 427/44, 54.1, 355, 359, 427/362; 156/242, 245, 246, 272

[56] References Cited

U.S. PATENT DOCUMENTS

| | | | |
|---|---|---|---|
| 2,361,082 | 10/1944 | Brown | 427/164 |
| 3,607,380 | 9/1971 | Thams | 427/44 |
| 3,684,348 | 8/1972 | Rowland | 350/103 |
| 3,935,359 | 1/1976 | Rowland | 156/245 |
| 4,042,654 | 8/1977 | Leszyk et al. | 427/44 |
| 4,113,894 | 9/1978 | Koch | 427/54.1 |

FOREIGN PATENT DOCUMENTS

1493114 11/1977 United Kingdom .
1493115 11/1977 United Kingdom .

OTHER PUBLICATIONS

Kramer et al., "Eduology", vol. 4, No. 1, 1973.

Primary Examiner—John H. Newsome
Attorney, Agent, or Firm—Norman N. Spain

[57] ABSTRACT

The invention relates to a method of reproducing plastics record carriers, in particular duplicating video records. According to the invention, a metal die is used which is provided with a thin-liquid molding resin of a particular composition which can be polymerized by radiation. A radiation-pervious substrate which is manufactured from synthetic material, for example polymethylmethacrylate, is provided on the molding resin. The molding resin is exposed to light via the substrate after which the cured molding resin together with the substrate connected thereto is removed from the die. The molding resin used in the process comprises low-molecular monomers or oligomers which contain on an average 25-70% by weight of hydrocarbon groups and/or phenyl groups. The molding resin is aprotic and has a functionality as regards unsaturatedness which is between the values 2 and 6. A suitable molding resin contains mono-, tri- or tetra esters of acylic acid. The molding resin preferably has a swelling capacity with respect to the substrate and for that purpose preferably comprises a vinylmonomer. The metal die used in the method preferably is a quite flat die which is obtained by providing the master disk which is a flat glass plate with information track with a nickel layer, gluing hereon a flat stiffening plate and then removing the master disk. The resulting father disk may be used as a die. Alternatively, further metal copies may be made herefrom which are provided in a simpler manner with a flat stiffening plate. The invention also extends to the molding resin, substrate and die used in the method, as well as to the resulting plastics record carriers.

15 Claims, 3 Drawing Figures

METHOD OF DUPLICATING PLASTICS INFORMATION CARRIERS

This is a continuation of application Ser. No. 887,188 filed Mar. 16, 1978 now abandoned which application is in turn a division of application Ser. No. 774,973, filed Mar. 7, 1977, and now abandoned.

The invention relates to a method of duplicating plastics information carriers in which a polymerizable molding resin is provided on a die containing an information track, which resin on the side remote from the die is provided with a substrate and, after curing of the molding resin, the assembly of molding resin and substrate connected thereto is removed from the die.

In this connection the invention concerns preferably the manufacture of so-called video (optical) records in which the information track comprises very fine optical information.

Such a method is known from German Offenlegungsschrift No. 24 43 020. According to this known process which, due to the use of a molding resin, is briefly termed a molding process, a specially manufactured silicone rubber die is used. In another commonly employed process of manufacturing plastic video records, the so-called compression molding process, a die manufactured from metal is used.

In order to obtain a better insight of the present invention the above-mentioned known processes are explained as follows.

A compression molding process for the manufacture of video records which is analogous to the compression molding process for phonograph records conventionally used for years already, is described in the published Netherlands Patent Application No. 7212045 filed in the name of Applicants. In this process a die manufactured from nickel is used which has been obtained by first electrolessly plating and then nickelplating a master disk, a glass disk having a circular or spiral-like information track of cured photoresist, and then removing the master disk. The resulting father disk may be used as a die but usually further so-called first copies (mother disk) are made from the father disk by electrodeposition, then from the mother disks second copies are made, and so on. The last copies are termed dies. When making plastics video records the die is pressed on a thermoplastic moulding mass at elevated temperature and pressure, said mass consisting, for example, of a copolymer of vinyl chloride and vinyl acetate, after which the assembly is cooled and, after removing the pressure, the moulded disk is finally removed from the die. One of the drawbacks of the compression molding method is that there exists a difference in expansion between the die and the molded disk during cooling so that undesired stresses occur in the disk which may result in loss or deformation of the optical information. In addition small particles of the synthetic resin often remain adhering to the metal die so that the subsequent copies show defects. The die becomes either useless or must be cleaned. Furthermore, the compression moulding process shows a rather long cycle time and requires a good deal of energy. Stringent requirements have to be imposed upon the plastic synthetic resin used as regards stability in shape especially in the long run and under considerably varying climatological conditions.

In the molding process known from the above-mentioned Offenlegungsschrift a special die is used which is also manufactured according to a molding process. For that purpose the glass master disk is provided with a release agent on which a liquid vulcanizable polysiloxane (silicone rubber) is provided which contains 10% by weight of catalyst. A second glass plate which is provided on one side with an adhesive, is pressed on the silicone rubber layer with the adhesive layer lowermost, after which the assembly is cured at elevated temperature of 71°–204° C. and finally the master disk is removed.

The resulting die consists of a glass disk which is provided on one side with a silicone rubber coating which comprises the information track. For making plastic copies a liquid mixture of polyurethane resin is prepared which consists of polyurethane resin, thinner and catalyst. This mixture is provided on a substrate of Mylar polyester film after which the coated substrate is pressed against the rubber coating of the die by means of a rolling process. It is alternatively possible first to pour the mixture of polyurethane resin on the rubber coating of the die and then providing the polyester film thereon. The polyurethane resin with polyester substrate provided on the die is then cured, the curing time varying from 15 to 45 minutes in accordance with the composition of the polyurethane resin. The resulting laminated disk of cured polyurethane with the polyester film is finally removed physically from the die. According to the text of the above-mentioned Offenlegungsschrift, an epoxy resin or acrylic resin may alternatively be used instead of polyurethane resin. Instead of the Mylar polyester film, a thin and flexible metal foil may alternatively be used. It is furthermore stated on page 14, third paragraph of the Offenlegungsschrift No. 24 43 020 that monomers which are polymerizable by radiation, as described in the Broadbent patents, may be used. In the Broadbent patents, there is disclosed to a duplicating process for video disk records in which a gaseous monomer which can be polymerized with ultraviolet light is used, for example, acrolein and parylene vapour.

The duplicating process according to the above-mentioned Offelengungsschrift has the following drawbacks. First of all, a very special silicone rubber die has to be manufactured.

In Applicant's opinion, the choice of this particular material is based on the requirement that the copy has to be easily releasable from the die. During the manufacture of the silicone rubber die, curing of the rubber takes place at elevated temperature. As a result of differences in thermal expansion between the rubber die and master disk to be manufactured, small differences in dimension may occur. In particular for the reproduction of video information in which a very high resolving power is required, small differences in dimension may adversely influence the reproduction quality. A further drawback is the comparatively long curing time of the copy (polyurethane with polyester film) in the die. The curing time may of coarse be reduced by performing the operations at higher temperatures, but then again the undesired differences in thermal expansion play a role which deteriorate the transfer of video information and furthermore result in thermal stresses in the copy. As a result of said stresses, deformation of the copy and loss or deformation of video information may take place in the course of time. A further drawback is the restricted stability of the resin mixture. The curing begins as soon as the polyrethane resin has been added to the catalyst.

It has furthermore been found that the surface of the silicone rubber die is apt to be attached by molding resins, in particular those containing polymerizable monomers.

Applicant's have now developed a method of duplicating plastic record carriers which does not exhibit the above-mentioned drawbacks.

The invention relates more in particular to a method of duplicating plastics information carriers in which a polymerizable molding resin is provided on a die provided with an information track which resin, on the side remote from the die, is provided with a substrate and, after curing the molding resin, the assembly of molding resin and substrate connected thereto is removed from the die, and is characterized in that a die is used of which at least the surface comprising the information track is manufactured from metal, a liquid moulding resin which can be polymerized by radiation is then provided on the metal surface, said resin containing low molecular monomers and/or oligomers which on an average contain from 25 to 70% by weight of saturated hydrocarbon groups and/or phenyl groups, the molding resin being entirely or substantially entirely aprotic and having an average functionality as regards unsaturatedness which lies between the values 2 and 6 inclusive, in which furthermore the molding resin, on the side remote from the die, is provided with a radiation-pervious substrate, the molding resin is then cured by radiation through the substrate and the polymerized molding resin together with the substrate connected thereto is then removed from the die.

The use of a metal die or a die having a metal surface in the molding process according to the invention is of importance. As already stated above, metal dies have been used for some time already in compression molding processes for the manufacture of video records and phonograph records. Much know-how and experience has been built up in the course of the years as regards the manufacture and properties of metal dies, which makes its use in the molding process according to the invention very attractive. For example a metal die or a die having a metal surface is generally, and in particular at lower temperature, only slightly sensitive to attack by synthetic resins.

However, the use of a metal die in the method according to the invention is possible only if in combination herewith a special molding resin which can be cured by radiation is used and which shows the above-mentioned characteristics. Only in that case is the cured resin readily releasable from the metal die and at the same time it is strongly bound to the substrate.

Due to the importance of the radiation-curable molding resin, the substrate and the die in the method according to the invention, these elements will now be described in greater detail.

A. LIQUID RADIATION-CURABLE MOLDING RESIN

After providing the liquid molding resin on the metal surface of the die and providing it with a substrate, the resin is polymerized through the substrate by means of radiation, that is to say it is cured. According to the invention, the radiation may be both ultra-violet light having as is known an upper wavelength limit of 3900 Å, and visible light. The composition of the liquid molding resin which can be cured by exposure to U.V. light differs from that which can be cured by means of visible light in that a different type of catalyst is used. The catalyst is a material which upon exposure to light forms radicals which subsequently initiate the polymerization reaction of the remaining components of the moulding resin. The formation of radicals can be produced by light absorption of the catalyst itself but also by light absorption of a sensitizer which transfers the absorbed energy to the catalyst. In the case of a moulding resin which can be cured by U.V. light, an aromatic carbonyl compound, for example a benzoin derivative, for example, benzoin isobutylether, is often used as a catalyst. In a moulding resin which can be cured by means of visible light, a xanthene dye having an amine as an auxiliary material is often used as a catalyst, for example, orythrosin with dimethylamine-ethanol.

Liquid resin compositions which can be cured by radiation are often referred to in literature as "light-curable resins" or "ultra-violet-curable resins". Such a composition generally comprises one or more polymeric compounds comprising polymerizable groups in combination with polymerizable monomers which also serve as solvents or diluents. A small quantity of a catalyst, also referred to as a photo-initiator, is also present. The curing can take place in a short time, for example, in 1 to 300 seconds dependent upon the light intensity. The presence of atmospheric oxygen often extends the required curing time and often results in mechanically and chemically inferior products. The known photosensitive resins are used on an industrial scale for making a protective layer on metal, wood or sometimes on paper. Rigid, hard layers with a good adhesion are obtained. In particular the good adhesion to the above-mentioned materials is a highly desired property for the known application.

In the method according to the present invention, however, a radiation-curable liquid molding resin is used which does not adhere to a metal base, in this case the metal surface of the die.

In addition to this property of non-adhesion to a metal base, the molding resin which is used in the method according to the invention has the property of strongly adhering to the substrate surface. This substrate consists of a synthetic resin as will be described hereinafter.

On the basis of an extensive investigation, Applicants have succeeded in developing a new radiation-curable liquid molding resin which shows the above-mentioned adhesion characteristic. The molding resin furthermore comprises only few reactive groups after curing which otherwise might possibly give rise to a substantial post-curing. Furthermore, the cured resin layer shows such low inner stresses that no tensile or bending stress is exerted on the substrate. The molding resin also shows a low viscosity with a viscosity coefficient of almost 100 cP and preferably 1–10 cP, so that the application of the moulding resin to the die can readily be carried out without the inclusion of air bubbles.

The invention also relates to this new molding resin which is characterized by the following features:
(a) the molding resin comprises low-molecular monomers and/or oligomers,
(b) the monomers and/or oligomers used in the molding resin comprise on an average 25–70% by weight of saturated hydrocarbon radicals and/or phenyl groups,
(c) the molding resin is aprotic or substantially aprotic,
(d) the molding resin has an average functionality as regards unsaturatedness which is between the values of 2 and 6 inclusive:

These resins may be further characterized as follows.

(ad a) Also in connection in order to obtain a correct degree of viscosity, the molding resin contains very little polymer, for example, less than 5% by weight. For the same reason, further preference is towards a molding resin which consists mainly, that is for at least 95%, of low-molecular monomers. The term low-molecular in this context means an average molecular weight of the monomers used which is at most approximately 400. The oligomers used generally have a higher molecular weight, for example 500-2000.

(ad b) The said content of saturated hydrocarbons and/or phenyl groups is related to the desired moderately polar character of the molding resin after curing. A phenyl group, as well as of course a saturated hydrocarbon, may be considered to be an apolar group within the scope of the invention. It is very well feasible that the molding resin comprises certain monomers and/or oligomers the content of saturated hydrocarbon groups and/or phenyl groups of which is small. This has to be compensated for by the presence of other monomers and oligomers having a comparatively high content of saturated hydrocarbon radicals and/or phenyl groups such that on an average the above-mentioned percentage by weight of 25-70% is reached over the whole mixture. The average content of saturated hydrocarbon radicals and/or phenyl groups is preferably between 40 and 65% by weight.

(ad c) As a result aprotic character of the molding resin causes that starting from the resin no hydrogen bridges with the metal surface of the die are formed.

(ad d) The idea of functionality as regards unsaturatedness is described inter alia in "Principles of Polymer Chemistry, Paul J. Flory, Corneel Univ. Press, New York 1953, pages 31–33". In connection with the present invention, "average functionality as regards unsaturatedness" is to be understood to mean the average number of vinyl ($C=C$) groups per molecule multiplied by the factor two. This notion can be illustrated by a simple example of a mixture of 1 grammolecule of ethene (functionality=2) and 1 grammolecule of butadiene (functionality=4). The average functionality as regards unsaturatedness of this mixture is $$\frac{N \times 1 + N \times 2}{2N} \times 2 = 3$$

The factor $N \times 1$ mentioned in the denominator of the quotient relates to (Avogadro number) molecules of ethene which comprise per molecule one The factor $N \times 2$ relates to N molecules of butadiene with two per molecule.

In a preferred form of the molding resin according to the invention the average functionality as regards unsaturatedness is between the values 2.1 and 3.5 inclusive.

On the basis of the characteristic of the molding resin mentioned above sub (a) to (d), those skilled in the art can easily prepare a suitable molding resin.

Very suitable molding resins which have also been used in a preferred form of the invention comprise, in addition to the hereinbefore mentioned light sensitive catalyst, thin-liquid mixtures of low-molecular mono-, di-, tri- or tetra esters of acrylic acid. Such molding resins after exposure on the die show no or only little adhesion to the metal surface of the die. The mechanical separation of the die form the assembly of the cured molding resin with and substrate is easily carried out. From electron microscope studies it appears that the surface structure of the die comprising the information to be reproduced is present in the molding resin layer without defects.

Examples of the above-mentioned suitable esters of acrylic acid are bifunctional (functionality=2) monoacrylates, in particular alkylacrylates, phenylacrylate, alkoxyalkylacrylates and phenoxyalkylacrylates. Specific very suitable representatives hereof are, for example, ethylacrylate, n-butylacrylate, i-butylacrylate, hexylacrylate, heptylacrylate, octylacrylate, 2-ethylhexylacrylate, decylacrylate, dodecylacrylate, octadecylacrylate, othoxyethylacrylate and phenoxyethylacrylate. Furthermore tetrafunctional di-acrylates, in particular alkanedioldiacrylates and alkeneglycoldiacrylates may be employed. Of these may be mentioned specifically 1,3-propanedioldiacrylate, 1,3-butanedioldiacrylate, 1,6-hexanedioldiacrylate, 1,10-docanedioldiacrylate, diethyleneglycoldiacrylate, triethyleneglycoldiacrylate, tetraethyleneglycoldiacrylate and tripropyleneglycoldiacrylate. Very suitable hexafunctional triacrylates are, for example, trimethylolpropanetriacrylate and pentaerythritoltriacrylate.

Example of interesting acrylic acid esters of oligomers are polyethyleneglycoldiacrylate, polypropyleneglycoldiacrylate, polyesteracrylate, urethaneacrylate, epoxyacrylate and ethoxylated bisphenol A-diacrylate. Very suitable resin compositions according to the invention are recorded in the following table.

| moulding resin serial no. | Resin compositions Constituents | | | | | |
|---|---|---|---|---|---|---|
| | difunctional mono-acrylate | Wt. % | polyfunctional acrylate | Wt. % | initiator | Wt. % |
| 1 | 2-ethylhexylacrylate | 78 | 1,1,1-trimethylolpropane triacrylate | 20 | benzoinisobutylether | 2 |
| 2 | ethylacrylate | 78 | 1,1,1-trimethylolpropane triacylate | 20 | benzoinisobutylether | 2 |
| 3 | phenylacrylate | 78 | 1,1,1-trimethylolpropane triacylate | 20 | benzoinisobutylether | 2 |
| 4 | 2-ethoxyethylacrylate | 78 | 1,1,1-trimethylolpropane triacrylate | 20 | benzoinisobutylether | 2 |
| 5 | 2-ethoxyethylacrylate | 78 | pentaerythritoltetraacrylate | 20 | benzoinisobutylether | |
| 6 | octadecyl acrylate ethylacrylate | 73 17 | ethylenediacrylate | 8 | benzoinisobutylether | 2 |
| 7 | 2-ethoxyethylacrylate | 78 | ethylenediacrylate | 18 | benzoinisobutylether | 2 |
| 8 | 2-ethylhexylacrylate | 59 | butanedioldiacrylate 1,1,1-trimethylolpropane triacrylate | 19,5 19,5 | benzoinisobutylether | 2 |

The resin layer obtained after curing the molding resin is rather soft, in contrast with the hard layer which is obtained in the known application of U.V. molding resins as a protective layer on metal, wood or paper. It is hence not surprising that the above-mentioned molding resin compositions as such are not commercialized or recommended.

The surface structure (information track) of the cured resin layer according to the invention, however, is non-deformable also when in a subsequent treatment a thin metal layer, for example an Al-layer, is provided on the information surface, for example, by vapour deposition. Usually a protective lacquer is provided on the metal layer.

B. SUBSTRATE

The substrate which consists of plastics and has the shape of a plate, disk or foil mainly determines the mechanical properties of the plastics record carrier, for example a video disk, to be manufactured. Since the moulding resin is exposed to light via the substrate, the substrate should be pervious to the type of light used, hence to visible light or to ultra-violet light. The perviousness to visible light is self-evident; transparent or translucent substrate materials are useful. As regards the perviousness to ultra-violet light it may be noted that many synthetic resins comprise low-molecular materials such as stabilizers against degradation by sun light. If these low-molecular materials absorb U.V. light, a disk or foil of such a synthetic resin may be less suitable for use as a substrate in combination with a U.V.-curable molding resin. Experiments have proved that a disk or foil should at least have a transparency degree of 5%, to the relevant type of light but preferably more than 50%.

In a preferred embodiment of the method according to the invention, a foil, disk or plate is used as a substrate in a thickness between 200 μm and 1.5 mm and which consists of polyvinylchloride/acetate copolymer, polyvinylchloride, polycarbonate, polyester, polystyrene, cellulosetriacetate, celluloseacetobutyrate or mixtures thereof. Such a foil, plate or disk transmits sufficient light, in particular U.V. light, to cure the photosensitive moulding resin.

After exposure through the substrate, the thin layer of cured molding resin should readily adhere to the substrate. The molding resin according to the invention described in detail above readily adheres in general to the above-mentioned plastics. A less than optimum adhesion can be improved by previously roughening the substrate, for example, by treating with chloroform. The substrate may also be provided with an adhesive layer or top layer which has a good adhesion to the cured moulding resin. A good adhesive layer in the case of the substrate plexiglass (polymethylmethacrylate) for example, is a coating of polyvinylchloride/acetate copolymer. However, such an improvement of the adhesion requires extra treatments of the substrate.

Applicants have found that a good adhesion of the cured moulding resin to the substrate is associated with a certain attack of the substrate by the uncured molding resin.

In a preferred embodiment of the moulding resin according to the invention, the molding resin has a swelling capacity with respect to the substrate material.

This swelling capacity of the molding resin can be determined in a simple manner by dipping a substrate foil or substrate disk in the moulding resin for a certain period of time, for example, 1 to 6 hours, then removing the disk, drying and determining the increase in weight of the disk or foil.

The above-mentioned liquid molding resins on the basis of mono-, di-, tri- or tetra esters of acrylic acid as a rule have a sufficient swelling capacity with respect to the above-mentioned substrate plastics. It has been found experimentally, for example, that a molding resin according to the invention which contains 78% by weight of 2-ethylhexylacrylate, 20% by weight of trimethylolpropane triacrylate, and 2% by weight of initiator, produces an increase in weight of more than 0.5% in foils of inter alia polyvinylchloride/acetate copolymer, polyvinylchloride and polystyrene. The dipping time was 6 hours.

With a substrate consisting of polymethylmethacrylate (plexiglass) the adhesion was not optimum when the above-mentioned moulding resin was used. A plate of plexiglass which had been dipped in the above-mentioned resin for 6 hours hence showed only an increase in weight of less than 0.01%. The swelling capacity of the relevant moulding resin with respect to the substrate plexiglass thus is insufficient. In this connection it may be noted that the reference to a sufficient swelling capacity of the moulding resin with respect to the substrate foil or disk is true if the foil or disk shows an increase in weight of at least 0.1% upon dipping in the resin for 6 hours.

An insufficient swelling capacity of the moulding resin can be improved by incorporating in a preferred embodiment of the molding resin according to the invention at least one component which in itself has a sufficient swelling capacity. In a further preferred embodiment of the molding resin, said component is a vinylmonomer. The extra advantage is obtained that the component, upon exposure, also reacts with the remaining constituents of the resin so that a binding of the cured resin to the substrate is obtained. A suitable vinylmonomer is, for example, an alkylacrylate of which the alkyl group contains 2 or 3 carbon atoms or an alkoxy alkylacrylate of which both the alkoxy and the alkyl group contains 1 or 2 carbon atoms.

For illustration hereof it is observed that in the above example of insufficient adhesion to plexiglass the adhesion was improved by replacing the 2-ethylhexylacrylate in the resin composition by an equal amount of ethylacrylate. It was established by means of the dipping test that upon dipping a plate of plexiglass in ethylacrylate the plexiglass showed an increase in weight of more than 5% after 1 hour.

C. DIE

As already stated above, the metal dies, usually nickel dies, used in the compression molding process of video disks may be used in a method according to the invention. Such a die is disclosed, for example, in the previously mentioned published Netherlands Patent Application No. 7212045. A usual process for the manufacture of the metal die consists in that the master disk, that is a flat glass disk having an information track which usually consists of cured photoresist, is first provided in an electroless manner with a conductive metal layer, for example Ag or Ni layer, and is then electroplated with a metal layer, for example, a nickel layer, after which the glass disk with photoresist is removed. The fatherdisk obtained in this manner may be used as such as a die. Usually, further copies are made by electrodeposition, such as first, second, third copies, and so on, with which a whole family of metal copies is built up. The first copy made from the fatherdisk is sometimes termed mother disk. The last copies are referred to as dies.

Applicants have found, that although the starting material is a quite flat master disk, the metal copies produced herefrom show unevenesses which are usually small but which, in the compressionless moulding process according to the invention, result in plastics record carriers which are not entirely flat. As a result of this the quality of the plastics record carrier is adversely influenced.

It is to be noted that in a compression moulding process these unevenesses found by Applicants do not play a part because in such a process the die during operation is stretched flat on the cooling and heating block of the compression moulding die.

Applicants have observed that the unevenesses are caused in particular by internal stresses which are formed during the metallization in the copies derived from the master disk.

On the basis of this observation, the die used in a preferred embodiment of the method according to the invention is a substantially flat metal father disk or a metal copy obtained herefrom by electrodeposition. The term "substantially flat" means that the factual macroscopic flatness differs at maximum 10μ from the theoretical flat surface.

Such a die forms part of the present invention as such and is obtained by providing a master disk, which is a flat glass disk having an information track on one side, with a metal layer first in an electroless manner and then by electrodeposition on the side of the information track, providing hereon a flat stiffening disk in an adhering manner, then removing the master disk and, if desired, producing other metal copies by electrodeposition from the resulting flat father disk.

The electroless provision of a metal layer, for example an Ag-layer or Ni-layer, as well as the electrodeposition of a metal layer, for example an Ni-layer, is known in the art. Reference may be had to the above-mentioned Netherlands Patent Application No. 7212045. It is to be noted that the term "electroless provision" also includes the vapour-deposition or spraying of a metal layer.

As a result of the measures according to the above method in which it is of particular importance that first the flat stiffening disk is provided before the master disk is removed, no deformations by internal stresses can occur so that the flatness of the glass master disk is maintained in the resulting father disk.

As may be derived from the method, the resulting flat father disk consists of an electroless metal layer in which the information track is provided, an electrodeposited metal layer on the side of the electroless metal layer remote from the information track, and a flat stiffening disk connected to the electrodeposited metal layer in an adhesive manner.

According to the invention, the resulting further copies derived from the flat father disk by electrodeposition are preferably provided with the flat stiffening disk. For this purpose, during the manufacture of a first copy, the father disk provided with a stiffening disk is provided by electrodeposition with a metal layer, a stiffening disk is then provided hereon in an adhesive manner and the father disk is then removed. In an identical manner, second copies may be obtained from the resulting first copy and herefrom again third copies, and so on.

For the sake of good order it is to be noted that such flat copies consist of an electrodeposited metal layer which on one side comprises the information track and on the other side is provided with a flat stiffening disk connected thereto in an adhering manner.

As a stiffening disk may be used a rigid and flat metal disk, for example a disk of copper, nickel or aluminum, or a glass plate. The thickness of the disk is rather variable; for cost-price considerations a largest thickness of 10 mm is desired. The minimum thickness will be about 1 mm dependent on the material. The disk is adhered to the metal layer by means of a layer of glue, for example, a two components glue. Preferably a disk of metal or a metal alloy is used in combination with an electrically conductive adhesive, for example, an adhesive having dispersed metal particles, the advantage being obtained that during the electrodeposition manufacture of further metal copies the desired electric content is optimum. When a glass disk is used, a layer of adhesive may be used, if desired, which can be cured by radiation, for example U.V. light.

As a rule, the provision of a reinforcement disk during manufacturing the father disk should be carried out at the same temperature as that at which the layer of metal is provided on the glass master disk. The temperature of the electrodeposition bath used often is above room temperature and is, for example, 70° C. If the provision of the reinforcing disk should be carried out at a temperature lower than that used in the electrodeposition bath, the provided metal layer will shrink from the master disk due to differences in thermal expansion. In practice, operation at higher temperature is rather cumbersome and thus less attractive.

In a preferred embodiment of the method of manufacturing the father disk this drawback does not occur. According to the preferred embodiment a father disk is obtained by providing the glass master disk first in an electroless manner and then by electrodeposition with a metal layer having an overall thickness of at most 150 $\mu$m, providing hereon in an adhesive manner the flat stiffening disk at ambient temperature and then removing the glass master disk.

With a layer thickness of at most 150 $\mu$m, the grown metal layer will not shrink from the master disk not upon cooling either. This implies that the connection of the stiffening plate outside the electrodeposition bath takes place at normal ambient temperature, which facilitates the whole manufacture considerably. In general, the layer thickness of the grown metal layer will be from 60 to 80 $\mu$m.

Upon manufacturing electrodeposited copies of the father disk, shrinkage from the metal layer does not occur either with larger thickness of the grown metal layer, for example, 300-400 $\mu$m. This is because there is no difference in thermal expansion between the metal father disk and the metal copy, such as the mother disk and die. The further copies of the father disk can consequently be provided with the flat stiffening disk at normal temperature.

The technical performance of the method according to the invention of duplicating plastics record carriers, for example, the provision of the liquid radiation-curable moulding resin on the die surface and the provision of the substrate over the molding resin can be realized in several ways.

For example, the process may be carried out by means of a turntable. The die is laid on the flat horizontal metal disk of the turntable, of course with the information-containing surface uppermost. An excess of molding resin, for example 5-10 ml, is evenly provided on the die. The addition of the molding resin may be carried out, for example, by pouring it centrally on the die and then causing the molding resin to flow radially over the whole surface of the die by rotation of the die. The substrate foil or substrate plate is placed on the layer of molding resin in such manner that air inclusion is avoided. If desired, the substrate may be pressed with a roller. The assembly is rotated in such a manner that a part of the molding resin between the die and the substrate is flung away and thus the desired thickness of the resin layer is adjusted, for example, from 1-75 $\mu$m. After exposure via the substrate to the light of, for example, a high pressure mercury lamp, the finished plastics record carrier may be removed from the die.

On the information-containing side of the resulting video disk a reflecting and approximately 300 Å thick Al layer is usually provided by vapour deposition at reduced pressure. A protective coating of, for example, nitrocellulose lacquer is provided over the Al layer. The disk is finally cut to size and equilibrated after having provided a central aperture.

In the above example of the technical performance of the molding process according to the invention, molding resin and substrate are provided separately and successively on the die. It is alternatively possible to provide the substrate in a pre-treatment with a layer of molding resin and to provide this assembly on the surface of the die. The further treatment, for example exposure, runs off as in the above-mentioned example.

The plastics record carrier provided with an Al-layer obtained according to the method of the invention is read in the same manner as the known plastics record carrier obtained by a compression molding process. The reading takes place by means of a thin beam of light (laser light) which is directed on to the metal layer and is reflected there. The stored information is preferably read or scanned with a light beam which passes through the carrier material, is reflected by the Al layer and then emanates again through the carrier material. In contrast with the known record carrier obtained by a compression molding process, the carrier material of the record carrier according to the invention is not homogeneous but shows a laminated structure of cured molding resin and substrate. Herewith an inhomogeneity is introduced into the path to be traversed twice by the light beam. The inhomogeneity is, for example, a difference in index of refraction. It has surprisingly been found that in spite of this inhomogeneity the plastics record carrier obtained according to the method of the invention can be read through the carrier material and produces a qualitatively excellent reproduction of the stored information. This is the more surprising when considering that the video signal processed in the information track is based on a surface structure having differences in height of 0.1 to 0.2 $\mu$m which are based on the information.

The invention will now be described in greater detail with references to the following examples and the accompanying drawing, in which.

EXAMPLES

1. Manufacture of the die

Figure 1:
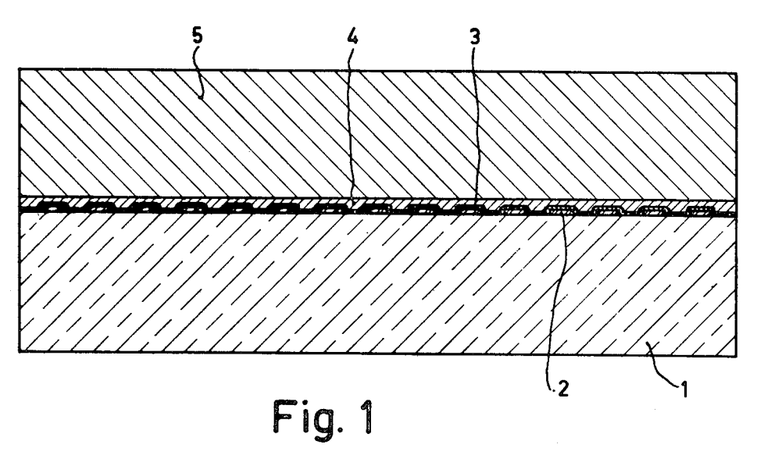
FIG. 1 is a cross-sectional view of a master disk having a metal layer and a stiffening plate.
Figure 2:
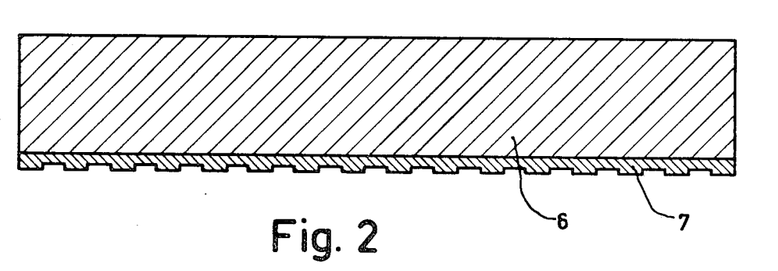
FIG. 2 is a cross-sectional view of a die having a stiffening plate.

A master disk consisting of a polished flat glass disk which in the drawing is given reference numeral 1 having thereon a spiral-like information track of cured photoresist 2 is electroless nickel-plated by treatment with an aqueous nickel salt solution containing $NiSO_4.6H_2O$. A second nickel layer 4 is provided in the usual electrodeposition manner on the resulting conductive nickel layer 3 which is approximately 300 Å thick. For this purpose the master disk 1,2 with the layer 3 is dipped in an aqueous electrolyte solution containing nickel sulfamate, boric acid and sodium laurylsulphate. The temperature of the solution is kept at 50° C. A voltage is set up across the electrolyte solution, the nickel layer 3 of the master disk serving as cathode. The voltage is slowly raised, for example 0.1 V per minute, until a current strength of approximately 40 Å is reached. After the total Ni layer has reached a thickness of 60$\mu$ with this current strength, the master disk 1,2 with the nickel peel 3,4 grown thereon is removed from the electrolyte solution, cooled in air to ambient temperature (room temperature), then washed with water and dried. A flat and stiff aluminium plate 5 whereby the factual macroscopic flatness of the surface differs maximally 10μ from the theoretical flatness is glued to said nickel peel. For gluing is used a two-components adhesive, for example an epoxy adhesive, for example araldite with an amine as a hardener. Although not strictly necessary, it is recommendable before gluing the plate 5 to peel 3,4, to slightly roughen the surfaces to be glued, for example by etching. For example, the nickel surface may be etched with $FeCl_3$ and the aluminum surface with sodium hydroxide solution. After curing the glue the master disk is separated mechanically from the nickel peel with glued aluminium plate. The remainders of photoresist possibly remaining on the information-carrying side of the nickel peel are dissolved by treatment with isopropylalcohol and methylisobutylketone. The resulting father disk which is shown in FIG. 2 consists of an aluminium plate 6 with nickel peel 7. Said father disk may be used as a die for making plastics copies. It is also possible to manufacture a family of dies from the father disk. For this purpose the nickel surface of the father disk is first passivated by treatment with an aqueous solution if $K_2CrO_7$ and then a 60μ thick nickel layer is grown hereon by electrodeposition (electrolytically). An Al plate is then provided hereon at room temperature in the same manner as described above, after which the father disk is removed. Further copies (dies) can be manufactured in an identical manner from the resulting mother disk and are also provided with a flat aluminium plate.

2. A quantity of 10 ml of a radiation-curable molding resin is provided in the centre of a metal die which is secured horizontally on a turntable and which is provided with a stiffening plate as is shown in FIG. 2.

The composition of the molding resin which is denoted by a serial number in column 1 of the table 11 below is stated in the "table of resin compositions" recorded in the introductory part of this specification. The molding resins referred to by the same serial number are identical. The composition of the metal die is recorded in column 2 of the table II below. The turntable is rotated for a few seconds, the centrally provided molding resin being distributed over the whole surface of the die. A circular plate, diameter 340 mm, which is manufactured from the light-pervious synthetic resin (substrate), recorded in column 3 of table II below, is carefully laid on the die provided with molding resin, possibly included air bubbles which are visible due to the light-pervious plate being removed from the layer of molding resin by means of a metal roller. It is to be noted that the plate of light-pervious synthetic material (substrate) is pretreated in some cases before it is provided on the layer of molding resin. The object of the pretreatment is to promote the adhesion of resin and plate. The pretreatment, if any, is recorded in column 4 of table II. In this column, PVC/PVA means that the plate on the side which is in contact with the resin is provided with a layer of polyvinylchloride/polyvinylacetate. The layer PVC/PVA is provided by disposing on the plate a solution of PVC/PVA in cyclohexanone and ethylacetate and centrifuging the plate at approximately 1000 rpm. The indication chloroform means that the plate has been pretreated with chloroform. Chloroform is poured on the plate and is removed again by centrifuging. The indication ethylacrylate means that the plate has been pretreated by dipping in ethylacrylate for 30 seconds.

After providing the plate, the resulting sandwich of die, layer of molding resin and plate is rotated at 1000 rpm for approximately 15 seconds. The excess of molding resin is removed, a homogeneous and thinner layer of molding resin being obtained. The thickness of the resin layer may vary between 0.2 and 300 μm but preferably is 1-75 μm.

Figure 3:
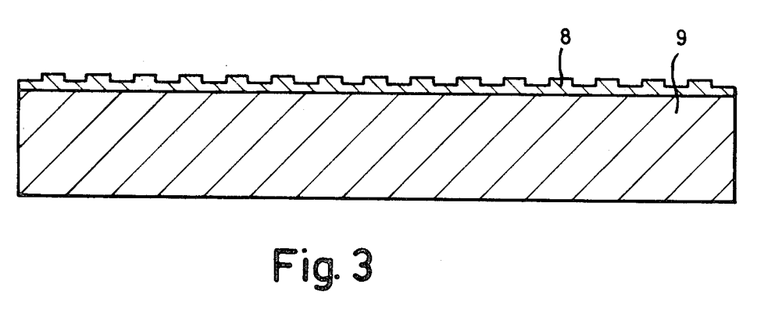
FIG. 3 is a cross-sectional view of a plastics record carrier.

The layer of molding resin is then exposed through the substrate to the light of a light source, for example, a "500 W water-cooled superhigh-pressure mercury lamp" arranged 40 cm above the sandwich or a series of several "TL20W fluorescent" lamps transmitting mainly light of 350 nm. In column 5 of table II below the type of lamp is recorded, SP500 being the above characterized mercury lamp and TL being the above fluorescent lamp. The exposure time is recorded in column 6 of table II. After the exposure the resulting plastics record carrier is removed from the die. The plastics record carrier is shown in FIG. 3 and consists of the cured resin layer 8 having an information track and the plate 9 of light-pervious synthetic resin secured thereto. The plastic record carrier (FIG. 3) is usually provided on the side of the information-containing layer of molding resin with a 300 Å thick Al layer (not shown in FIG. 3) which is vapour-deposited in a vacuum bell at a pressure of $10^{-4}$ to $10^{-5}$ Torr. Finally a protective layer of lacquer (not shown in FIG. 3) is provided on the Al layer by pouring nitrocellulose lacquer on the Al layer and then centrifuging the assembly, the nitrocellulose lacquer spreading over the whole Al layer as a thin layer.

TABLE II

| moulding region serial no. | material die | material substrate | substrate pre-treatment | light/ source | exposure time in sec. |
|---|---|---|---|---|---|
| 1 | electrodep. nickel | copolymer PVC/PVA | none | SP500 | 90 |
| 1 | " | PVC | none | SP500 | 90 |
| 1 | " | polymethylmethacrylate | PVC/PVA | SP500 | 90 |
| 1 | electrodep. nickel with top layer of electroless nickel | polymethylmethacrylate | ethylacrylate | SP500 | 60 |
| 2 | electrodep. nickel with top layer of electroless nickel | polymethylmethacrylate | none | SP500 | 300 |
| 3 | electrodep. nickel | polymethylmethacrylate | none | SP500 | 60 |
| 4 | " | polymethylmethacrylate | none | SP500 | 60 |
| 5 | electrodep. nickel with top layer of electroless nickel | polymethylmethacrylate | chloroform | TL | 120 |
| 6 | electrodep. nickel | polymethylmethacrylate | none | SP500 | 60 |
| 7 | " | polycarbonate | none | SP500 | 60 |
| 7 | " | polymethylmethacrylate | none | SP500 | 60 |
| 7 | " | polystyrene | none | SP500 | 60 |

TABLE II-continued

| moulding region serial no. | material die | material substrate | substrate pre-treatment | light/ source | exposure time in sec. |
|---|---|---|---|---|---|
| 7 | electrodep. nickel with top layer of electroless nickel | polymethylmethacrylate | none | TL | 120 |
| 8 | electrodep. nickel with top layer of electroless nickel | polymethylmethacrylate | PVC/PVA | TL | 120 |

What is claimed is:

1. The method of manufacturing a plastic information carrier containing an information track having detail of such fineness as to be suitable for reading by an optical beam or similar reading means, said fineness being as small as in the order of a micron or less, comprising:
   (a) directly applying to a metal surface of a rigid, substantially flat die, which surface contains the negative of the desired information track, a thin layer of a thickness of 0.2–300 microns of a light-curable polymerizable liquid having a viscosity of from 1 to 100 cP and comprising low molecular weight acrylic monomers or a mixture of low molecular weight acrylic monomers and acrylic oligomers, which liquid contains 25–70% by weight of saturated hydrocarbon and/or phenyl groups, has an average functionality in regard to unsaturatedness of between 2.1 and 6, is at least substantially aprotic and consists for at least 95% of monomers having a maximum average molecular weight of about 400;
   (b) applying to the exposed surface of said thin layer of polymerizable liquid a thin light-pervious plastic substrate;
   (c) exposing said thin layer of polymerizable liquid to light radiation through said substrate for a time sufficient to cause said thin layer of polymerizable liquid to cure to a solid state adhering to said substrate thereby producing a laminate of said substrate and said cured layer containing the desired optically readable information track readily removable from said die without effect on said laminate or said die; and
   (d) removing said laminate from said die.

2. The method of claim 1 wherein the average content of saturated hydrocarbon groups and/or phenyl groups in the polymerizable liquid lies between about 40 and 65% by weight.

3. The method of claim 2 wherein the polymerizable liquid contains a liquid mixture of low molecular weight mono-, di-, tri- or tetraesters of acrylic acid.

4. The method of claim 3 wherein the polymerizable liquid contains esters of acrylic acid selected from the group consisting of alkylacrylates, phenylacrylates, alkoxyalkylacrylates, alkanedioldiacrylates, akyleneglycoldiacrylates, trimethylolpropanetriacrylate, pentaerythritoltriacrylate, polyethyleneglycoldiacrylate, polypropyleneglycoldiacrylate, polyesteracrylate, urethane acrylate, epoxy acrylate and ethoxylated bisphenol A-diacrylate.

5. The method of claim 4 wherein the polymerizable liquid contains in addition as a component having a swelling capacity with respect to the substrate material a vinyl monomer.

6. The method of claim 5 wherein polymethylmethacrylate is employed as the substrate and the component having the swelling capacity is an alkyl acrylate wherein the alkyl contains 2 or 3 carbon atoms or an alkoxylalkyl acrylate wherein both the alkoxy and alkyl moieties contain 1 to 2 carbon atoms.

7. The method of claim 1 wherein the substrate has a thickness of 200 microns to 1.5 millimeters, is foil, plate or disk shaped and consists essentially of polyvinylchloride acetate copolymer, polyvinylchloride, polycarbonate, polyester, polystyrene, cellulose triacetate, cellulose acetobutyrate or mixtures thereof.

8. The method of claim 1 wherein the substrate is a disk, plate or foil shaped member having a thickness of 200 microns to 1.5 millimeters and consists essentially of polymethylmethacrylate.

9. The method of claim 1 wherein the die and the resultant information carrier are both disk shaped.

10. The method of claim 1 wherein after separation from the die a thin light-reflective metal layer is applied over the exposed surface of the cured layer.

11. The method of claim 10 wherein the metal layer is an aluminum layer.

12. A plastic information carrier produced by the method of claim 1.

13. A method of manufacturing a plastic information carrier containing on a major surface an information track optically readable through the carrier, comprising the steps:
   (a) bringing into contact relationship with a metal surface of a rigid substantially flat die, a thin layer of a thickness of 0.2–300 microns of a light radiation-curable polymerizable liquid having a viscosity of from 1 to 100 cP and comprising low molecular weight acrylic monomers and/or acrylic oligomers which on an average contains 25–70% by weight of saturated hydrocarbon radicals and/or phenyl groups, and which liquid has an average molecular weight of approximately 400 or less, and which liquid has an average functionality as regards unsaturatedness in the range of 2.1 to 6, and which liquid is substantially aprotic, said polymerizable liquid containing less than 5% by weight of polymers, having the properties that will cause it, when cured, to be substantially stress-free and to adhere to a contacting plastic substrate but to be removable without damage from the die metal surface, and also having the property that it will fill when liquid and stably retain when cured any fine surface structure present on the die surface;
   (b) said die metal surface to which the polymerizable liquid is contacted is substantially flat and contains a fine surface structure pattern having surface level differences less than 1 micron in size and constituting the negative of the said information track to be replicated on the information carrier;
   (c) providing in contact relationship with the exposed surface of said thin layer of polymerizable liquid while still in the liquid state, which exposed surface is remote from the surface in contact with the die, a thin light radiation-pervious plastic substrate to whose contacting surface said polymerizable liquid adheres when cured;

(d) exposing said thin layer of polymerizable liquid while in contact with the die to curing light radiation through said contacted substrate for a time sufficient to cause said thin layer of polymerizable liquid to cure to a solid layer adhering to said substrate but removable without damage from said die metal surface thereby producing a laminate of said substrate and said cured layer whose major surface contacting the die contains a replica of the fine surface structure pattern present on the die metal surface;

(e) removing said laminate from said die; and (f) applying over the exposed cured layer surface containing the fine surface pattern a thin light-reflective layer thereby to form the plastic information carrier containing the optically-readable information track.

14. A method as claimed in claim 13 wherein the polymerizable liquid incorporates a component which has a swellable effect on the contacting substrate surface.

15. A method as claimed in claim 13 wherein the substrate contacting surface is subjected to a pretreatment for improving its adhesion to the polymerizable liquid before it is contacted to the latter.

* * * * *